United States Patent [19]
Kemmochi et al.

[11] Patent Number: 5,968,259
[45] Date of Patent: Oct. 19, 1999

[54] HIGH-PURITY QUARTZ GLASS AND METHOD FOR THE PREPARATION THEREOF

[75] Inventors: Katsuhiko Kemmochi, Kouriyama; Hiroyuki Miyazawa, Takefu; Hiroyuki Watanabe, Takefu; Kiyotaka Maekawa, Takefu; Chuzaemon Tsuji, Takefu; Manabu Saitou, Sabae, all of Japan

[73] Assignee: Shin-Etsu Quartz Products Co., Ltd., Tokyo, Japan

[21] Appl. No.: 08/917,933

[22] Filed: Aug. 27, 1997

[51] Int. Cl.⁶ .................................................. C30B 29/18
[52] U.S. Cl. ................................ 117/7; 117/2; 117/943; 501/54; 65/99.4; 29/25
[58] Field of Search ..................................... 65/99.4, 32.5, 65/391, 68; 501/54, 4; 117/2, 7, 943; 29/25.35; 422/68.1, 906

[56] References Cited

U.S. PATENT DOCUMENTS

| | | | |
|---|---|---|---|
| 4,632,686 | 12/1986 | Brown | 65/18.1 |
| 4,804,422 | 2/1989 | Papanikolau | 134/28 |
| 4,818,510 | 4/1989 | Jung | 423/335 |

OTHER PUBLICATIONS

"Standard Methods for the Examination of Water and Wastewater". 18th edition Greenberg. pp. 3–4 to 3–7, 1992.

*Primary Examiner*—Robert Kunemund
*Attorney, Agent, or Firm*—Nikaido Marmelstein Murray & Oram, LLP.

[57] ABSTRACT

Provided are high-purity quartz glass having a high purity, in particular, with little zirconium (Zr) and manufactured at low costs from natural quartz as the starting material and a method for the preparation thereof. High-purity quartz glass is manufactured, in a method for the preparation of natural quartz glass which is prepared by subjecting crystalline natural quartz to fusion by heating, in conducting refining of the starting material of the crystalline natural quartz by successively practicing a combination of at least one unit refining procedure, in a procedure in which a portion of the starting quartz after practicing the specified unit refining procedure is taken by sampling for analysis, the same is decomposed with hydrofluoric acid or an acid mixture of hydrofluoric acid and another inorganic acid, the decomposition solution is subjected to evaporation to dryness either as such or after addition of another inorganic acid, the residue is melted by heating with admixture of a salt or hydroxide of an alkali metal, the salt or hydroxide of the alkali metal is then dissolved in an aqueous solution of an inorganic acid or in pure water, the solution is subjected to quantitative analysis for the impurities therein to determine the contents of impurities in the crystalline natural quartz and the refined crystalline natural quartz, of which the content of impurities has been found to be lower than a specified value, is subjected to fusion by heating as a starting material to prepare high-purity quartz glass.

3 Claims, No Drawings

HIGH-PURITY QUARTZ GLASS AND METHOD FOR THE PREPARATION THEREOF

BACKGROUND OF THE INVENTION

1. Field of the Invention

The present invention relates to quartz glass used in the semiconductor industries and optical communications and a method for the preparation thereof and, more particularly, relates to quartz glass such as, for example, a quartz glass crucible for pulling-up of a single crystal of silicon containing a very small amount of the element of zirconium as well as a method for the preparation thereof.

2. Description of the Related Art

In the preparation of quartz glass by fusion and vitrification of natural quartz as the starting material, heretofore, preparation is conducted by, when high-purity quartz glass is required, subjecting a starting material to heating and fusion after upgrading the purity through several kinds of unit refining procedures.

The principal unit refining procedures include pulverization, particle size classification, flotation, magnetic separation, etching, high-temperature heating, heating treatment in a halogen-containing atmosphere, electrolytic refinement and the like.

Even by using a starting material imparted with a high purity in this manner and preventing contamination during fusion by heating as far as possible, several elements cannot still be completely removed. And, some of them are the elements which cause degradation of the performance when used in the semiconductor industries or for the optics. The progress of the semiconductor industries and the optical technologies in recent years has come to a stage on which a content of the level heretofore admissible is no longer admissible as a detrimental content.

As to the element of zirconium, in particular, while it is construed to be natural that the content thereof in natural quartz glass is about 1 ppm or so, it is desired to accomplish a further decrease, preferably, not to exceed 0.8 ppm. Incidentally, the unit of ppm in this specification for the expression of the concentration refers to "ppm by weight" giving the concentration in weight.

Even when a high-purity quartz powder is obtained by fully utilizing the conventional refining procedures mentioned above so as to ensure a content of the element of zirconium not to exceed 0.2 ppm by analysis, however, there can be a disadvantage that the quartz glass obtained by the fusion thereof may eventually contain about 1 ppm of the element of zirconium.

When a quartz glass crucible for pulling-up of a single crystal prepared in this way containing about 1 ppm of the content of the zirconium element was used, a high-quality single crystal of silicon as in the use of a synthetic quartz glass crucible of a content of the zirconium element not exceeding 0.2 ppm could not be obtained.

The present invention, which has been completed in view of the above described situations, has an object to provide high-purity quartz glass with high purity and, in particular, containing little zirconium (Zr) prepared at low costs from natural quartz as the starting material as well as a method for the preparation thereof.

SUMMARY OF THE INVENTION

In order to accomplish the above mentioned object, the method for the preparation of high-purity quartz glass according to the present invention is characterized in that, in a method for the preparation of natural quartz glass which is prepared by subjecting crystalline natural quartz to fusion by heating, in conducting refining of the starting material of the crystalline natural quartz by successively practicing a combination of at least one unit refining procedure, a portion of the starting quartz after practicing the specified unit refining procedure is taken by sampling for analysis, the same is decomposed with hydrofluoric acid or an acid mixture of hydrofluoric acid and another inorganic acid, the decomposition solution is subjected to evaporation to dryness either as such or after addition of another inorganic acid, the residue is melted by heating with admixture of a salt or hydroxide of an alkali metal, the salt or hydroxide of the alkali metal is then dissolved in an aqueous solution of an inorganic acid or in pure water, the solution is subjected to quantitative analysis for the impurities therein to determine the contents of impurities in the natural crystalline quartz and the refined natural crystalline quartz, of which the content of impurities has been found to be lower than a specified value, is subjected to fusion by heating as a starting material to prepare high-purity quartz glass.

Following methods are usually undertaken as a refining method of a natural quartz starting material. In the first place, a natural quartz starting material is pulverized to give a powder from which a high-purity quartz powder is obtained by washing, flotation, magnetic separation, etching with hydrofluoric acid and the like. In conducting these treatments, the method described in the official publication of Japanese Patent Laid-open Publication No. 52-121017 (flotation), the method described in the official publication of Japanese Patent Publication No. 38-21986 (acid washing) and so on can be applied.

A quartz powder containing about 1 to 2 ppm of the element of zirconium can be obtained usually from a raw ore containing a few % of the zirconium element. Incidentally, quartz powders are crystallographically identical with a crystalline quartz powder so that they are not differentiated in this specification.

In the next place, a heat treatment is undertaken at about 1000° C. in an atmosphere containing an element of halogen in order to further decrease the alkali elements, iron element or copper element. This treatment is known as a means to remove usual impurities (official publication of Japanese Patent Laid-open Publication No. 48-69794). This treatment gives a refined starting material containing 0.2 ppm or less of alkali elements and 0.1 ppm or less of copper element. When evaluation is made here by the conventional analytical method of quartz glass, refinement has been accomplished seemingly also for the element of zirconium to be 0.2 ppm or lower.

Conventional known methods for the analysis of quartz glass include those methods in which the same is decomposed by using hydrofluoric acid and converted into a solution which is analyzed by using a flameless atomic absorption spectrophotometer or, after evaporation thereof to dryness, it is recovered with diluted nitric acid and analysis is conducted by the ICP-AES (inductively coupled plasma atomic emission spectrometry) or ICP-MS (inductively coupled plasma mass spectrometry). Further, utilization of an improved method, as is disclosed in the official publication of Japanese Patent Laid-open Publication No. 7-72056, in which decomposition and evaporation to dryness with hydrogen fluoride gas are concurrently undertaken, has also been started.

In the analytical method used in the method of the present invention, on the other hand, evaporation to dryness is followed by the recovery of the residue with a molten alkali compound. This alkali compound is further converted into an aqueous solution and this solution is quantitatively analyzed by a conventional means for separation and analysis.

When conducted in this way, it was found that about 1 ppm of the element of zirconium was sometimes found by analysis even from a quartz powder which had seemingly been refined to have 0.2 ppm or less according to a conventional analytical method.

According to a method such as the neutron radioactivation analysis, the element of zirconium can be analyzed for the entire content irrespective of the existing state thereof. Even when the refining is seemingly complete by the conventional analytical method in which decomposition with hydrofluoric acid is followed by the analysis of the decomposition solution by the ICP-AES and the like, it is sometimes the case that refining further proceeds to give a content of zirconium of 0.8 ppm or less or, further, 0.3 ppm or less when refining is repeated or the starting material is highly susceptible to refining.

In the conventional analytical methods, there was seemingly no correlation between the content of the element of zirconium in the quartz powder as the starting material and the content of the element of zirconium in the quartz glass prepared therefrom. It is only by the application of the analytical method of the present invention that a good coincidence can be obtained in the analytical values between the content of the element of zirconium in the quartz powder as the starting material and the content of the element of zirconium in the quartz glass obtained therefrom.

When selection by analysis was undertaken in the conventional method, for example, it is in about 30% of the eases that, even when quartz glass products are manufactured from a quartz powder in which the content of zirconium does not exceed 0.8 ppm, unacceptable products containing larger than 0.8 ppm of zirconium are produced.

In contrast thereto, absolutely no unacceptable products were produced when selection by analysis was made by the method of the present invention. A possibility has also been established to control contamination in the process of fusion in such a way that the content of zirconium in the quartz glass product is identical with the content of zirconium in the starting material.

The inventors have arrived at the following discovery as a result of the extensive investigations with an object to obtain quartz glass crucibles containing a particularly small amount of the element of zirconium (Zr). Though effective to decrease zirconium (Zr), the procedure of flotation or washing with hydrofluoric acid has a substantial limitation that the content of zirconium can hardly be decreased to be 1 to 2 ppm or lower. When the same and a quartz glass product obtained by the fusion thereof are analyzed by the conventional method, coincidence is obtained between the content of zirconium (Zr) in the quartz powder as the starting material and the content of zirconium (Zr) in the quartz glass product.

The content of the element of zirconium (Zr) can be further decreased by undertaking a heat treatment in an atmosphere containing an element of halogen. Although a decrease can be obtained in the true overall content, the analysis by a conventional method leads to a result which suggests refinement seemingly more rapid than actual. Namely, a single heat treatment in a halogen-containing atmosphere may give an analytical value of zirconium (Zr) of 0.2 ppm or lower in the crystalline quartz powder as the starting material while it is sometimes the case that the analytical value of zirconium (Zr) in the quartz glass obtained by the fusion thereof is 1.0 ppm.

When a heat treatment is undertaken in an atmosphere containing an element of halogen, conventional analytical methods cannot give information on the overall content of zirconium (Zr) actually contained in a quartz powder. The overall content of zirconium (Zr) actually contained in a quartz powder can be determined only by the method of the present invention by using a fused alkali compound On the other hand, the content of zirconium (Zr) contained in quartz glass obtained by fusion and vitrification can be accurately determined not only by the analytical method undertaken in the method of the present invention but also by the conventional analytical methods.

It is not definite whether or not the velocity at which the element of zirconium (Zr) is decreased by heating in an atmosphere of halogen depends on the history or origin of the starting material. Quartz powders as the starting material of a low zirconium (Zr) content can be employed with stability only by the selection with a knowledge of the analytical result of the zirconium (Zr) content after heating in a halogen atmosphere and, as a result, quartz glass products of low zirconium (Zr) content can be manufactured in a good yield.

According to the investigations by the inventors, the only other method, by which the overall content of zirconium can be determined as in the analytical method undertaken in the present invention for zirconium, is the neutron activation analysis. This method is an expensive method because, for example, large facilities are required as a neutron source and the number of available facilities is small throughout the world not to be suitable for conducting rapid analysis. This is hardly adaptable as a built-in analytical method in the manufacturing line for quality monitoring.

Following is a detailed description of the analytical method undertaken in the inventive method. In the first place, a crystalline quartz powder is heated in a pressurizable acid-decomposition vessel together with hydrofluoric acid to be decomposed and converted into a solution. It is optional to replace this hydrofluoric acid with an acid mixture of hydrofluoric acid and another inorganic acid. The inorganic acid other than hydrofluoric acid here implied includes nitric acid and sulfuric acid.

In the next place, this solution containing hydrofluoric acid as a principal constituent is heated in an open condition so that vaporizable fluorosilicic acid is evaporated and dissipated to effect disappearance of silicon constituents leaving a residue containing the impurities alone. The procedure of "evaporation to dryness" used in the analytical chemistry not always means a drying procedure to give a solid. If a drying treatment is conducted so far as to give a solid, it is sometimes the case that recovery cannot be accomplished with a diluted acid in the successive procedures.

This treatment of evaporation to dryness has an object to completely effect evaporation and dissipation of vaporizable substances so that "evaporation to dryness" also includes a procedure in which a small amount of sulfuric acid is added as an non-vaporizable acid and heated until rising of a white fume of sulfuric acid is found. In particular, this is sometimes called "evaporation to white fuming" in order to make a differentiation. In the present invention, silicon and fluorine as the principal constituents can be completely removed by undertaking evaporation to white fuming with addition of sulfuric acid. Besides sulfuric acid, the acid added in conducting evaporation to white fuming can be nitric acid or perchloric acid.

In the present invention, the evaporation to dryness is followed by alkali fusion. The procedure called alkali fusion is a procedure in which a compound of an alkali metal such as salts not in the form of an aqueous solution is melted by heating to be converted into a liquid at a temperature of several hundreds degrees centigrade or higher having a strong dissolving power in which the objective substance is dissolved.

In particular, for example, borax or sodium tetraborate as an anhydrous salt thereof is heated as a salt of an alkali metal in a platinum vessel at a temperature of 800° C. or higher. Sodium tetraborate containing no water of crystallization is more convenient in respect of the good availability of a high-purity reagent and absence of splashing due to elimination of the water of crystallization. Other alkali compounds such as NaCl, NaOH and the like can also be used. Platinum-made vessels can be used satisfactorily as the vessel for alkali fusion.

The molten salt is converted into a solid alkali salt by cooling to room temperature. This is readily dissolved in a diluted aqueous solution of an acid such as, for example, diluted hydrochloric acid, diluted nitric acid and the like. It is preferable to heat to such an extent that boiling does not take place in order to promote dissolution.

The aqueous solution obtained in the above is imparted with a specified volume by a conventional method and subjected to the determination of the concentration of the impurities dissolved therein. When analysis is performed for the element of zirconium (Zr) as the particularly important element in the method of the present invention, the ICP-AES can be used satisfactorily.

In a refining method satisfactorily undertaken in the method of the present invention, the above mentioned crystal natural quartz material is heated in an atmosphere containing an element of halogen. And, the element of zirconium can be named as the objective for the determination of impurities in the method of the present invention and high-purity quartz glass such as a quartz glass crucible for pulling-up of a silicon single crystal can be obtained by setting the content of the element of zirconium not to exceed a specified value or, preferably, not to exceed 0.8 ppm.

Preparation of the high-purity quartz glass such as a quartz glass crucible for pulling-up of a silicon single crystal can be performed according to a conventional method and, for example, by filling a refractory mold rotating around a vertical axis with a powder of starting quartz material which is heated from inside to be fused.

The above and other objects, features and advantages of the present invention will become manifest to those skilled in the art on making reference to the following description of preferred embodiments.

DETAILED DESCRIPTION OF THE INVENTION

In the following, the present invention is described in more detail by way of examples although the present invention is never limited thereto in any way.

EXAMPLE 1

A powder of natural quartz for the manufacture of quartz glass obtained from a pegmatite ore deposit by ore dressing and refinement was subjected to a continuous heat treatment in a rotary kiln of which the staying time at 1150° C. was 1 hour under a stream of chlorine and hydrogen chloride gas.

Samples for analysis were collected from the quartz powder after the treatment in an amount to correspond to 10 lots, of which a 5 g portion was put into a hermetically sealable vessel together with 25 ml of a 50% hydrofluoric acid and subjected to acid decomposition under pressurization by heating 4 hours at 160° C. After cooling, the decomposition solution was transferred to a platinum dish under care so as not to lose any invisible undissolved Zr-containing particles and 2 to 3 drops of sulfuric acid were added thereto followed by evaporation to dryness until rising of a white fume of sulfuric acid was noted.

The residue after the evaporation to dryness was melted by heating at 800° C. or higher with admixture of 2 grams of sodium borate anhydride ($Na_2B_4O_7$). The molten material after cooling was dissolved in diluted hydrochloric acid and converted into a specified volume of 50 ml with addition of pure water and this aqueous solution was subjected to the analysis and determination of the content of the element of zirconium (Zr) by the ICP-AES.

The starting materials of the quartz powder were subjected to selection of those lots alone in which the content of zirconium (Zr) was from 0.5 to 0.7 ppm and a refractory mold rotatable around a vertical axis was filled with the staring material of quartz powder which was heated from inside and fused so as to prepare 20 crucibles for pulling-up of a silicon single crystal by fusion and shaping.

The thus obtained crucibles were subjected to the determination of the content of zirconium (Zr) to find that the content of zirconium (Zr) was in the range from 0.5 to 0.7 ppm in all of the crucibles.

Comparative Example 1

In the same manner as in Example 1, a natural quartz powder for the manufacture of quartz glass after ore dressing and refinement from a pegmatite ore deposit was subjected to a continuous heat treatment in a rotary kiln of which the staying time at 1150° C. was 1 hour under a stream of chlorine and hydrogen chloride gas.

The content of the zirconium (Zr) element in the quartz powder after the treatment was determined by the conventional analytical method. Namely, 5 grams of the quartz powder after the treatment were taken in a hermetically sealable vessel together with 25 ml of 50% hydrofluoric acid and subjected to acid decomposition under pressurization by heating at 160° C. for 4 hours. After cooling, the decomposition liquid was transferred into a platinum dish and evaporated to dryness with addition of 2 to 3 drops of sulfuric acid until rising of a white fume of sulfuric acid was noted. The residue recovered with diluted hydrochloric acid was diluted into a specified volume of 50 ml with pure water and this aqueous solution was subjected to the determination of the content of the zirconium (Zr) element by ICP-AES.

The analytical values of zirconium (Zr) observed for all of the lots did not exceed 0.2 ppm which was the lower limit of quantitative determination by the analytical method. By using this quartz powder as the starting material, 20 crucibles for pulling-up of a silicon single crystal were prepared by filling a refractory mold rotating around a vertical axis with the quartz powder and fusing from inside by heating.

The thus obtained crucibles were subjected to the determination of the content of zirconium (Zr) therein to give a result that 14 of the crucibles had a content of Zr in the range from 0.5 to 0.8 ppm while 6 of the crucibles had a content of Zr in the range from 0.9 to 1.2 ppm.

EXAMPLE 2

Silicon single crystals having a nominal diameter of 8 inches were pulled up by using the crucibles of different contents of zirconium (Zr) prepared in Example 1 described above. Three single crystals could be pulled up consecutively by using those of which the content of Zr was from 0.5 to 0.8 ppm.

Comparative Example 2

By using the crucibles of different contents of zirconium (Zr) prepared in the above described Comparative Example 1, silicon single crystals were pulled up in the same manner as in Example 2. When the crucibles of which the content of Zr was from 0.9 ppm to 1.2 ppm were used, the first single crystal could be pulled up normally but grain boundaries were introduced into the crystal of the second run in the course of pulling up to interrupt the pulling up. The attempt to pull up a single crystal again in this state failed due to unsuccessful seeding so that no other way than discarding could be found for the remaining silicon melt.

According to the method of the present invention for the manufacture of quartz glass, the content of zirconium (Zr) can be analyzed accurately and conveniently at low costs at the stage of the powdery starting material even by undertaking the refining step of the starting crystalline quartz powder in combination with a heat treatment in an atmosphere of a halogen gas so that crucibles can be efficiently manufactured at a desirable purity relative to zirconium (Zr).

When a crucible of which the content of zirconium does not exceed 0.8 ppm prepared in this manner, a plurality of single crystals having a larger diameter of as large as 8 inches of the nominal diameter could be pulled up consecutively.

According to the present invention, as is described above, a great advantage can be obtained that quartz crucibles of high purity of, in particular, low zirconium (Zr) can be manufactured at low costs from natural quartz as the starting material.

What is claimed is:

1. A method for the preparation of high-purity quartz glass, in a method for the preparation of natural quartz glass which is prepared by subjecting crystalline natural quartz to fusion by heating, in conducting refining of the starting material of the crystalline natural quartz by successively practicing a combination of at least one unit refining procedure, comprising the steps of:

taking a portion of the said starting quartz after practicing the specified unit refining procedure by sampling for analysis;

decomposing the same with hydrofluoric acid or an acid mixture of hydrofluoric acid and another inorganic acid;

subjecting the decomposition solution to evaporation to dryness either as such or after addition of another inorganic acid;

melting the residue by heating with admixture of a salt or hydroxide of an alkali metal;

then dissolving the salt or hydroxide of the alkali metal in an aqueous solution of an inorganic acid or in pure water;

subjecting the solution to quantitative analysis for the impurities therein to determine the contents of impurities in the crystalline natural quartz;

and subjecting the refined crystalline natural quartz, of which the content of impurities has been found to be lower than a specified value, to fusion by heating as a starting material to prepare high-purity quartz glass.

2. The method for the preparation of high-purity quartz glass according to claim 1, wherein the above mentioned specified unit refining procedure is a heating treatment of the above mentioned starting material of crystalline natural quartz in an atmosphere containing an element of halogen and the impurity as the objective of the analysis in the crystalline natural quartz is the element of zirconium.

3. The method for the preparation of high-purity quartz glass according to claim 2, wherein the content of the element of zirconium in the above mentioned refined crystalline natural quartz does not exceed 0.8 ppm.

* * * * *